United States Patent [19]

Brighton et al.

[11] Patent Number: 4,996,133

[45] Date of Patent: Feb. 26, 1991

[54] SELF-ALIGNED TUNGSTEN-FILLED VIA PROCESS AND VIA FORMED THEREBY

[75] Inventors: Jeffrey E. Brighton, Katy; Douglas P. Verret, Sugarland, both of Tex.

[73] Assignee: Texas Instruments Incorporated, Dallas, Tex.

[21] Appl. No.: 137,389

[22] Filed: Dec. 23, 1987

Related U.S. Application Data

[63] Continuation-in-part of Ser. No. 80,116, Jul. 31, 1987, Pat. No. 4,842,991.

[51] Int. Cl.⁵ ................................................. G03C 5/00
[52] U.S. Cl. .................................... 430/313; 430/316; 430/317; 430/318; 437/192; 437/195; 437/228; 437/229
[58] Field of Search ............... 430/317, 318, 313, 314, 430/316; 437/189, 192, 195, 228, 229

[56] References Cited

U.S. PATENT DOCUMENTS

| 4,614,021 | 9/1986 | Hulseneh | 437/189 |
| 4,764,484 | 8/1988 | Mo | 437/203 |
| 4,789,648 | 12/1988 | Chen et al. | 437/225 |

Primary Examiner—Jose G. Dees
Attorney, Agent, or Firm—Melvin Sharp; Thomas DeMond; Lawrence J. Bassuk

[57] ABSTRACT

Via patterns (16, 18) are applied to a first interlevel oxide layer (58) down to a metal layer (52) to define a plurality of orifices. These orifices (61, 63) are filled with tungsten by selective chemical vapor deposition. A first level conductor pattern (10, 12, 14) is then used to etch away the first insulator layer (58) and portions of plugs (62, 64) that are outside the first level conductor pattern. This first level conductor pattern is also used for a subsequent first level metal etch. The entire structure is then covered with a self-planarizing oxide layer (82), which is subsequently etched back to expose the top surfaces (66, 68) of tungsten plugs (62, 64).

19 Claims, 2 Drawing Sheets

SELF-ALIGNED TUNGSTEN-FILLED VIA PROCESS AND VIA FORMED THEREBY

RELATED APPLICATION

This application is a Continuation-in-Part of application Ser. No. 080,116 filed July 31, 1987 U.S. Pat. No. 4,842,991.

TECHNICAL FIELD OF THE INVENTION

This invention relates in general to semiconductor process technology and more particularly to processes for forming vias between two conductors using selective metal vapor deposition, and vias produced thereby.

BACKGROUND OF THE INVENTION

A number of methods have been investigated for reducing the size of vias between metal layers. Current conventional techniques include the pillar method and the chemical vapor deposition - tungsten via fill method.

The pillar process provides a metal plug connecting two layers of metal, which plug may be self-aligned on the edge of the lower level metal. The pillar is non-nested, i.e., does not require that the patterning be inside the lower level lead lateral boundary. The pillar process includes an oxide planarization which provides a flat surface for the upper level metal. This process has, however, a high process complexity, an additional photomask level when compared to a standard via process, and a very critical planarization process that is susceptible to interlevel shorts.

The conventional via fill process allows vias to be etched with straight walls that greatly improve size control when compared to sloped vias. However, these vias must be aligned to the lower metal layer, and therefore, are required to be nested within the leads. For the conventional via fill process, therefore, it is necessary to either flare the leads or further reduce the via size. The former technique reduces the metal packing density, and the latter technique increases via resistance and current density.

A need has therefore arisen in the industry for a method for building a via which is self-aligned to the edge of the lower metal layer and takes advantage of the CVD-tungsten via fill method. A need has further appeared in the industry for a process that greatly reduces the likelihood of interlevel shorts.

SUMMARY OF THE INVENTION

The present invention comprises an integrated circuit having a via formed to a conductor. An elongate conductor is formed on a support layer such that sides of the conductor extend outwardly (upwardly) from the support layer. An outer surface of the conductor has a lateral boundary defined by the sides. A first insulator layer is formed only on this outer surface, with an area of the outer surface not covered by the first insulator layer. The insulator layer defines first and second edges of the area. Third and fourth edges of the area are defined by the outer conductor surface boundary. A second insulator layer is formed to cover all the sides that adjoin the area. A bottom of the via is formed by the area, with sidewalls of the via formed by the first and second insulator layers. The via is filled with a conductive material such as tungsten selectively deposited therein such that the outer surface of the conductive material is substantially coplanar with an outer surface of the first insulator layer.

Another aspect of the invention comprises a method for fabricating a via between conductors. According to this method, a first insulator layer is formed on the surface of a conductor layer. An orifice through the insulator layer is formed to a first area of the conductor surface. The orifice is then filled with a metal plug selectively deposited by chemical vapor deposition. A conductor geometry border is then masked on the first insulator layer and the metal plug such that the border intersects a border of the orifice at at least two points. The first insulator layer and the metal plug are then removed to the extent that it is outside of the conductor geometry border. The conductor layer is also removed outside of this geometry border. In this manner, a first conductor is defined that adjoins a metal plug top surface above it that is not covered by the first insulator.

A second insulator layer is next formed to cover the first conductor, the first insulator and the metal plug. A predetermined portion or depth of the second insulator layer is removed sufficient to reexpose the top surface of the metal plug and a second conductor is formed to contact the surface. In a preferred embodiment, the method further includes the step of planarizing the second insulator layer prior the step of removing portions of it until the conductor area is reexposed.

The present invention provides a significant technical advantage over prior art vias in that very small filled vias can be obtained that are self-aligned edge-on with the first level conductor. The via fill provides a planar surface (i.e., the tungsten is planar with the first insulator layer surface) allowing the second conductor to be flat. This results in optimum reliability and also allows the same process to be repeated to form a second via between second and third metal directly above the first via. The process of the present invention is able to produce a self-aligned, filled edge-on via that is less than one micron in diameter.

BRIEF DESCRIPTION OF THE DRAWINGS

Further aspects of the invention and their advantages may be discerned from the following Detailed Description in conjunction with the appended Drawings in which.

DETAILED DESCRIPTION

Figure 1:
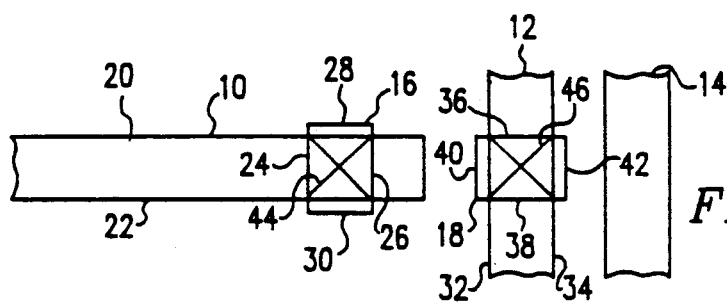
FIG. 1 is a highly magnified schematic plan view showing the juxtaposition of a mask for a plurality of first metal conductors on a support layer, and also showing intersecting via patterns.

FIG. 1 is a plan view of a photomask layout of the invention, showing the placement of three first-level conductors and two vias that are to be opened through an intervening interlevel oxide layer to them. The photomask layout includes a horizontally-disposed elongate conductor lead outline 10 and vertically-disposed, elongate first-level conductor outlines 12 and 14. A via pattern 16 is superimposed over an area of conductor 10, and a via pattern 18 is superimposed over conductor 12. Conductor outlines 10, 12 and 14 comprise a first-level conductor geometry or pattern, and vias 16 and 18 comprise an interlevel insulator layer geometry.

As shown, elongate sidewall boundaries 20 and 22 of first conductor outline or pattern 10 intersect longitudinally-disposed sidewall boundaries 24 and 26 of via pattern 16. Horizontally-disposed boundaries 28 and 30 of via pattern 16 fall outside of elongate boundaries 20 and 22 of conductor pattern 10.

Similarly, elongate sidewall boundaries 32 and 34 of longitudinally disposed conductor pattern 12 intersect horizontally-disposed boundaries 36 and 38 of via pattern 18. The longitudinally disposed boundaries 40 and 42 fall outside of boundaries 32 and 34 of conductor pattern 12. In the illustrated embodiment, conductor pattern 14 does not have a via pattern superimposed thereon, indicating that no via will be formed to this conductor within the illustrated area.

While via patterns 16 and 18 are respectively sited at points between the ends of conductor patterns 10 and 12 such that pattern 16 intersects conductor pattern 10 at four points and such that pattern 18 intersects conductor pattern 12 at four points, patterns 16 and 18 may also be sited exactly on the ends of respective conductor patterns 10 and 12. In this case, boundaries 20 and 22 will intersect via pattern boundary 24 at two points, and would intersect via pattern boundary 26 at an infinite number of points. A similar condition would obtain for the intersection of conductor boundaries 32 and 34 and via pattern boundaries 36 and 38.

While it is preferred that conductor patterns 10 and 12 be rectangularly elongate and that via patterns 16 and 18 be rectangular in shape, patterns 10, 12, 16 and 18 can take any desired shape, as long as the boundaries of via patterns 16 and 18 are farther apart in one dimension than the boundaries of patterns 10 and 12.

As will be described in more detail below, the intersection of via pattern 10 with via pattern 16 will define the via to a respective first-level conductor. The via area is shown by an "X" 44. Likewise, "X" 46 will define the area as seen in plan view of a via formed to the conductor corresponding to conductor pattern 12.

Figure 2A:
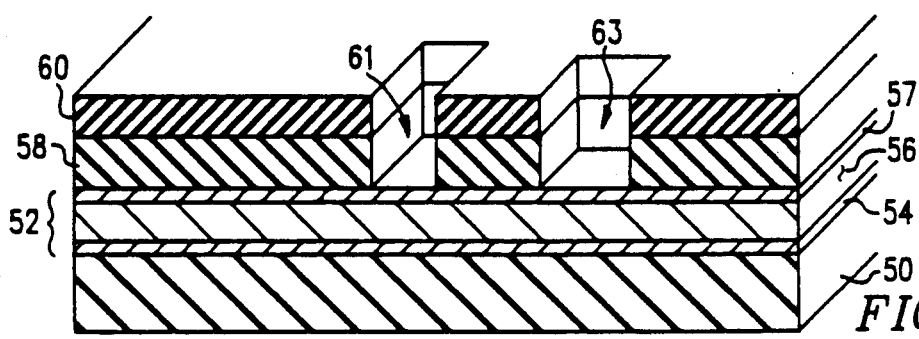
FIGS. 2a-2e are highly magnified schematic isometric views showing successive stages in the fabrication of a plurality of vias according to a preferred embodiment of the invention.

Turning now to FIG. 2a, the first steps in a preferred via fabrication process according to the invention are schematically shown in a magnified sectional and isometric view. A support layer 50 is provided, which for example may be a semiconductor substrate, a dielectric material, or a partially-formed integrated circuit to which connections are desired to be made. A conductor layer 52 is deposited on support layer 50. In the illustrated embodiment, conductor layer 52 comprises a first layer 54 of titanium tungsten alloy (Ti-W), a second layer 56 of aluminum and a third layer 57 of Ti-W. Layers 54, 56 and 57 are illustrated only by way of example; other combinations of metal layers, or a single metal monolayer, or even a nonmetal conductor such as doped polycrystalline silicon may be deposited in their stead.

A first insulator layer 58 is next deposited over metal layer 52. Layer 58 may be deposited by, for example, a low-pressure chemical vapor deposition, and may comprise silicon dioxide. A layer 60 is photoresist is next deposited over first insulator layer 58. Photoresist layer 60 is patterned with via pattern 16 and 18 (see FIG. 1). An etch is performed on the masked first insulator layer 58 down to metal layer 52 to form orifices 61 and 63.

Figure 2B:
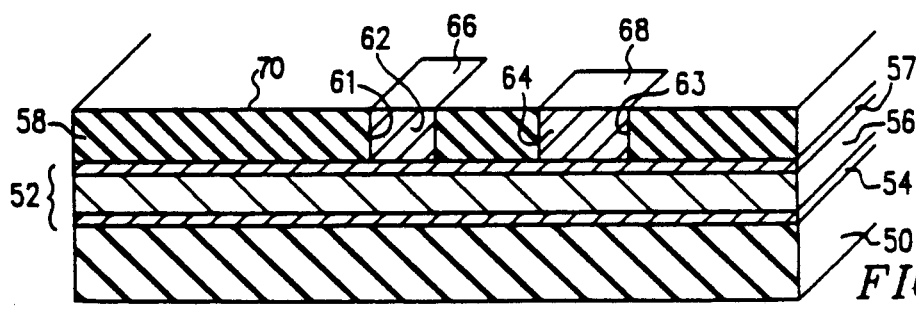

Turning next to FIG. 2b, photoresist layer 60 is removed and a selective chemical vapor deposition (CVD) of a conductive material, such as tungsten or another metal, is performed. The metal is selected such that it will be preferentially nucleate on the surface of metal layer 52 exposed inside orifices 61 and 63, as opposed to dielectric layer 58. Where tungsten is the metal chosen for selective CVD, Ti-W layer 57 is required to prevent the formation of AlF$_3$ on the exposed aluminum. This reaction takes place because WF$_6$ is used as the tungsten-depositing reactant.

This selective CVD step is carried on until the orifices 61 and 63 are filled to create metal plugs 62 and 64. Metal plugs 62 and 64 are accumulated until their respective outer surfaces 66 and 68 are substantially coplanar with the outer surface 70 of first insulator layer 58.

In an alternative embodiment (not shown), the selective CVD step is replaced with a selective metal plating step, either by electroplating or electroless plating, with a metal such as gold or copper. In this instance, refractory metal layer 57 would be replaced with an appropriate seed layer. The copper or gold would be selectively plated on the seed layer until orifices 61 and 63 were filled.

The via fill may also be accomplished by a resist etchback. According to this second alternative embodiment (not shown), the chosen metal is nonselectively deposited over outer surfaces 70 and in vias 61 and 63. The metal surface resulting from this step will have dimples or depressions over the filled vias. A sacrificial organic layer is then next differently deposited so as to be thicker over the depressions and thinner elsewhere, yielding a planar surface. An etchant is then used to simultaneously etch the organic layer and the metal set substantially the same rate back to the surface 70 of first insulator layer 58.

Figure 2C:
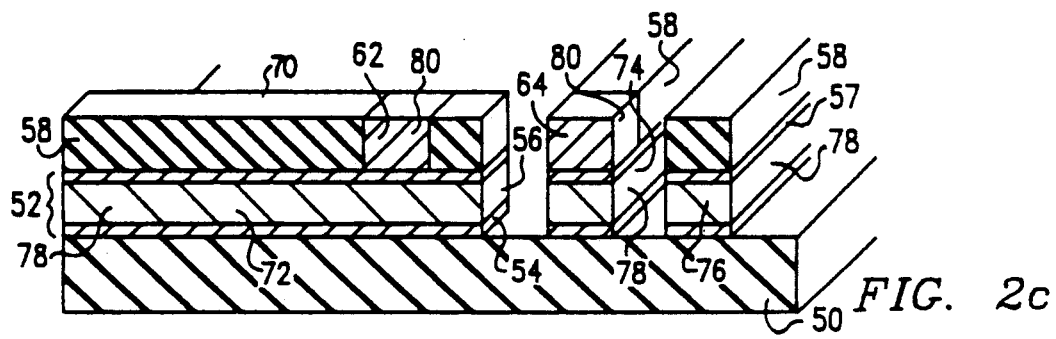

Turning now to FIG. 2c, further stages in the fabrication process according to the invention are shown. A first conductor photoresist layer (not shown) is deposited on first insulator layer 58 and metal plugs 62 and 64. This photoresist layer is patterned with the first-level conductor patterns 10, 12 and 14 (shown in FIG. 1). An etch is then performed to remove those portions of layer 58 and plugs 62 and 64, outside of the first-level pattern boundaries. This etch step may be performed in one step with an etchant such as carbon tetrafluoride, or may be performed by two etch steps sequentially in situ.

After the plug-and first insulator-etch step, metal layers 54, 56 and 57 are etched using the same first-level pattern down to support layer 50. This last etch step will form out of the first metal layer 52 a plurality of first-level conductive leads 72, 74 and 76.

The first insulator layer 58 will exist after this etch step only on top of leads 72, 74 and 76. Sidewalls 78 of leads 72–76 are exposed at this stage. Metal plugs 62 and 64 will be reduced in volume, as they will now have sidewalls 80 that are coplanar with respective first conductor sidewalls 78. This etch step will therefore also define the final configuration of metal plugs filled (or vias) 62 and 64.

Figure 2D:
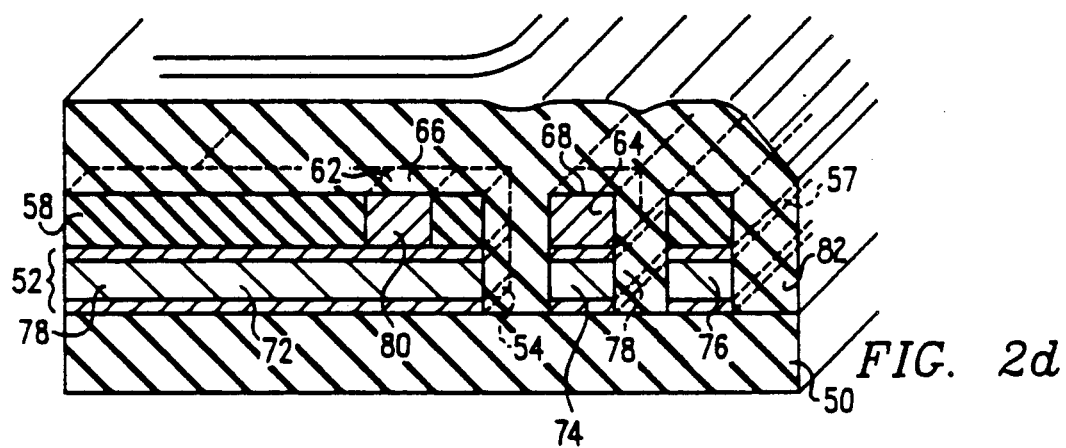

Turning now to FIG. 2d, a second insulator layer 82 such as oxide is deposited over the entire structure. It is preferred that oxide 82 be deposited in a self-planarizing step, such that its depth over leads 72–76 will be less than the depth over adjacent regions of support layer 50.

However, an alternative planarization process (not shown) can be used whereby a conformal thick oxide layer is deposited over leads 72–76 and support layer 50. This deposition would be followed by the deposition of a sacrificial organic layer on top of the conformal second insulator layer. The sacrificial organic layer may, for example, be applied to the top of the conformal second insulator layer by spinning, such that this organic layer would be thicker in the valleys of the second insulator layer and thinner across the eminences thereof. A planarized surface would then be presented for etching, and an etchant would be selected to etch back the sacrificial layer and the second insulator layer at substantially the same rate. This etchback would continue until top surfaces 66 and 68 of respective plugs 62 and 64 are reexposed.

Layer 82 is deposited to completely cover sidewalls 78 and 80 of the first level leads 72–76 and metal plugs 62 and 64.

Figure 2E:
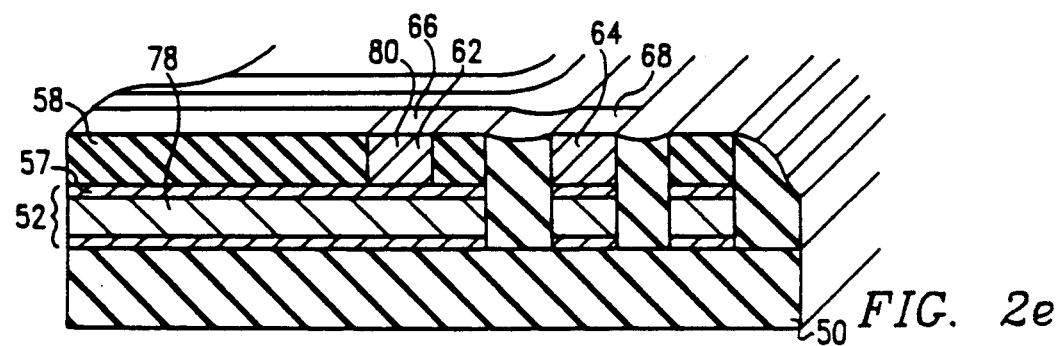

In FIG. 2e, an isometric view of the structure is illustrated subsequent to an etch-back of second insulator layer 82. This etchback will Preferably expose only the top surfaces 66 and 68 of metal plugs 62 and 64, leaving metal leads 72–76 completely buried by a thick layer of dielectric material. Oxide layer 82 slopes gradually away from the areas where leads 72–76 are buried. Subsequently, one or more second level conductors (not shown) are deposited on top of second insulator layer 82 to make contact to selected ones of metal plugs 62 and 64.

The process of the invention provides a significant advantage in that it combines the advantages inherent in a planarized surface provided by a via fill process with the extremely small via size obtained by a self-aligned via. Since the via is self-aligned to at least one edge of the conductor lead, the via can be proportionately larger with respect to the size of the conductor lead.

In summary, a self-aligned selective tungsten-filled via process has been described. A via pattern is first etched into a first interlevel oxide layer to a first level metallic layer, and the orifices thus created are selectively filled with tungsten. Then, a first level metal lead pattern is applied to define a plurality of first level metal leads and a plurality of filled vias on top of them. A second insulator layer is deposited over the entire surface and etched back to expose only the top surfaces of the tungsten plugs.

While illustrated embodiments and their advantages have been described in the above Detailed Description, the invention is not limited thereto, but only by the spirit and scope of the appended claims.

What is claimed is:

1. A method for fabricating a via through an insulator layer to a conductor, comprising the steps of:
   forming a conductor layer on a support layer;
   forming an insulator layer on the conductor layer;
   opening an orifice in the insulator layer to the conductor layer;
   filling the orifice with a conductive material such that an outer surface of the conductive material is substantially coplanar with an outer surface of the insulator layer;
   etching the insulator layer, the conductive material and the conductor layer to define a conductor that laterally intersects the orifice; and
   insulating all surfaces of the conductor laterally outside of a via formed by the area of lateral intersection of the conductor and the orifice.

2. The method of claim 1, and further including the step of filling the orifice with metal by a selective chemical vapor deposition.

3. The method of claim 1, and further including the step of selectively filling the orifice with metal by electroplating.

4. The method of claim 1, and further comprising the step of selectively filling the orifice with metal by electroless plating.

5. The method of claim 1, and further including the steps of:
   depositing the conductive material in the orifice and over the outer surface of the insulator layer;
   differently depositing a sacrificial organic layer on the conductive material such that the organic layer has a substantially planar outer surface; and
   etching the organic layer and conductive material back to be substantially coplanar with the surface of the insulator layer.

6. A method for fabricating a via between conductors, comprising the steps of:
   forming a first insulator layer on a surface of a conductor layer;
   forming an orifice through the insulator layer to a first area of the conductor surface;
   filling the orifice with a metal plug selectively deposited by chemical vapor deposition;
   masking a conductor geometry border on the first insulator layer and an outer surface of the metal plug such that the conductor geometry border intersects a border of the orifice at at least two points;
   removing those portions of the first insulator layer, the metal plug, and the conductor layer that are disposed outside of the conductor geometry border to define a first conductor and a metal plug outer surface not covered by the first insulator layer;
   forming a second insulator layer to cover the first conductor, the first insulator layer and the metal plug;
   removing a predetermined portion of the second insulator layer to reexpose the outer surface of the metal plug; and
   forming a second conductor to contact the outer surface of the metal plug.

7. The method of claim 6, and further including the step of masking the conductor geometry border on the first insulator layer and patterning the orifice such that the border of the conductor geometry intersects the border of the outer surface of the metal plug at four points.

8. The method of claim 6, wherein said step of masking the conductor geometry border includes the step of masking a conductor having two elongate sides, the sides intersecting the border of the orifice at at least two points.

9. The method of claim 6, wherein the orifice has a plurality of sidewalls including a first and second sidewall, the first sidewall intersecting the conductor geometry border at two points.

10. The method of claim 9, and further including the step of forming the conductor geometry such that the border thereof is coterminous with the second sidewall at a plurality of points.

11. The method of claim 10, wherein the conductor geometry is elongate, the metal plug to being sited on an end of the conductor geometry.

12. The method of claim 9, and further including the step of forming the conductor geometry such that the geometry intersects the second sidewall of the orifice at two points.

13. The method of claim 12, wherein the conductor geometry is elongate, the method including the further step of positioning the metal plug to be spaced from an end of the conductor geometry.

14. The method of claim 9, wherein the first and second sidewalls are substantially parallel to each other.

15. The method of claim 6, wherein said step of filling the orifice comprises the further step of selectively depositing tungsten in the orifice until an outer surface of the metal plug is substantially coplanar with an outer surface of the first insulator layer.

16. The method of claim 6, and further including the steps of:
   forming the second insulator layer over the metal plug, over the first insulator layer and over the conductor layer; and
   planarizing the second insulator layer previous to said step of removing the predetermined portion thereof, such that the surface of the second insulator layer after said step of removing the predetermined portion will be substantially continuous with the outer surface of the metal plug.

17. The method of claim 16, wherein said step of planarizing comprises the step of forming the second insulator layer through a self-planarizing process, such that the thickness of the second insulator layer over the first insulator layer and the metal plug will be less than the thickness of the second insulator layer in a region adjacent to and outside of the conductor geometry border.

18. The method of claim 16, and further including the steps of:
   differentially depositing a sacrificial layer on the second insulator layer, such that the sacrificial layer will be thinner over prominences formed in said second insulator layer and will be relatively thicker over depressions formed in the second insulator layer; and
   back-etching the second insulator and the sacrificial layer until the outer surface of the metal plug is re-exposed.

19. The method of claim 6, wherein said step of removing the first insulator layer and the metal plug outside of the conductor geometry border comprises the step of simultaneously etching the first insulator layer and the metal plug outside of the conductor geometry border.

* * * * *

UNITED STATES PATENT AND TRADEMARK OFFICE
CERTIFICATE OF CORRECTION

PATENT NO. : 4,996,133
DATED : October 30, 1990
INVENTOR(S) : Kausek

It is certified that error appears in the above-identified patent and that said Letters Patent is hereby corrected as shown below:

Col. 1, line 30 -   delete "." and substitute -- , --.

Col. 1, line 30 -   delete "The" and substitute -- the --.

Col. 1, line 36 -   delete "hinqe" and substitute -- hinge --.

Col. 1, line 47 -   delete "ranqe" and substitute -- range --.

Col. 1, line 48 -   after "use" insert --.--.

Col. 1, line 62 -   delete "hinqe" and substitute -- hinge --.

Col. 1, line 65 -   delete "enganinq" and substitute -- engaging -

Col. 2, line 18 -   delete "leqs" and substitute -- legs --.

UNITED STATES PATENT AND TRADEMARK OFFICE
CERTIFICATE OF CORRECTION

PATENT NO. : 4,996,133
DATED : October 30, 1990
INVENTOR(S) : Kausek

It is certified that error appears in the above-identified patent and that said Letters Patent is hereby corrected as shown below:

Col. 2, line 18 - delete "varyinq" and substitute -- varying --.
Col. 2, line 19 - delete "qirth" and substitute -- girth --.
Col. 6, line 46 - delete "D-rinq" and substitute -- D-ring --.
Col. 10, line 47 - delete "tot he" and substitute -- to the --.

Signed and Sealed this

Fourth Day of August, 1992

Attest:

DOUGLAS B. COMER

*Attesting Officer*   *Acting Commissioner of Patents and Trademarks*